United States Patent [19]

Sugino et al.

[11] Patent Number: 4,488,306
[45] Date of Patent: Dec. 11, 1984

[54] TERRACED SUBSTRATE SEMICONDUCTOR LASER

[75] Inventors: Takashi Sugino, Takatsuki; Kunio Itoh, Uji; Masaru Wada, Takatsuki; Hirokazu Shimizu, Toyonaka; Hiroyuki Mizuno, Takarazuka; Kazuo Fujimoto, Takatsuki, all of Japan

[73] Assignee: Matsushita Electric Industrial Co., Ltd., Kadoma, Japan

[21] Appl. No.: 358,104

[22] Filed: Mar. 15, 1982

[30] Foreign Application Priority Data

Mar. 20, 1981 [JP] Japan .................................. 56-40935

[51] Int. Cl.$^3$ .............................................. H01S 3/19
[52] U.S. Cl. ......................................... 372/46; 357/17
[58] Field of Search ................. 372/44, 45, 46; 357/17

[56] References Cited

U.S. PATENT DOCUMENTS 4,392,228 7/1983 Okabe et al. ......................... 372/46

Primary Examiner—James W. Davie
Attorney, Agent, or Firm—Cushman, Darby & Cushman

[57] ABSTRACT

In a semiconductor laser of terraced substrate type, comprising on a terraced substrate (11) of n-GaAs substrate, a first clad layer (12) of n-GaAlAs, an active layer (13) of non-doped GaAlAs, a second clad layer (14) of p-GaAlAs and a current limiting layer (15) of n-GaAs, and further thereon a thick overriding layer (19) of n-GaAlAs with strip shaped opening (191), are epitaxially formed, and a current injection layer (16) is formed by Zn diffusion through the opening (191) in a manner one corner (161) of the injection front penetrate the current limiting layer (15) and reaches the second clad layer (14). By means of thick overriding layer (19), shortcircuiting between the active layer (13) and a p-side electrode (7) is prevented.

7 Claims, 7 Drawing Figures

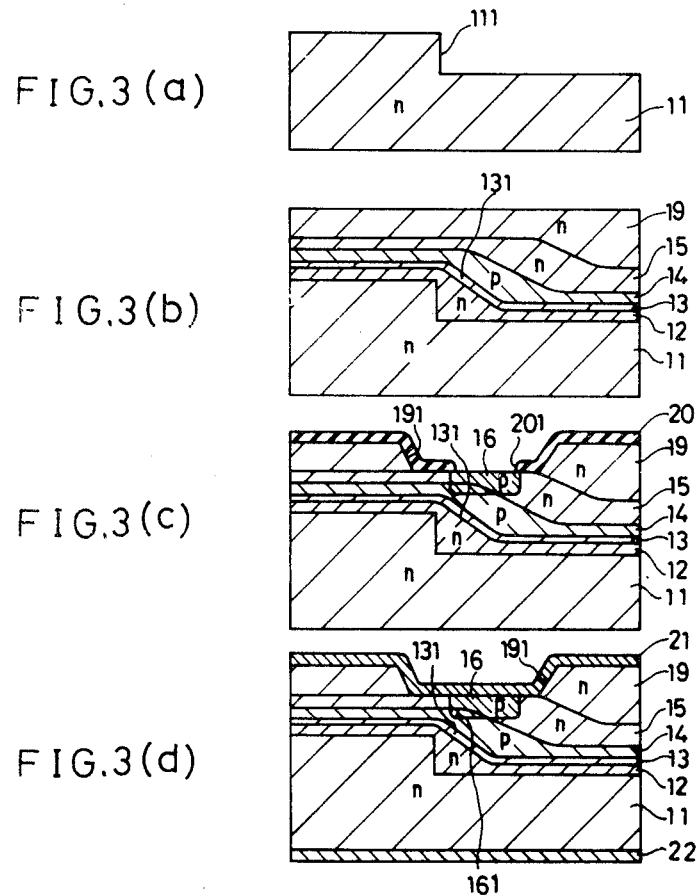
FIG. 3(a)
FIG. 3(b)
FIG. 3(c)
FIG. 3(d)
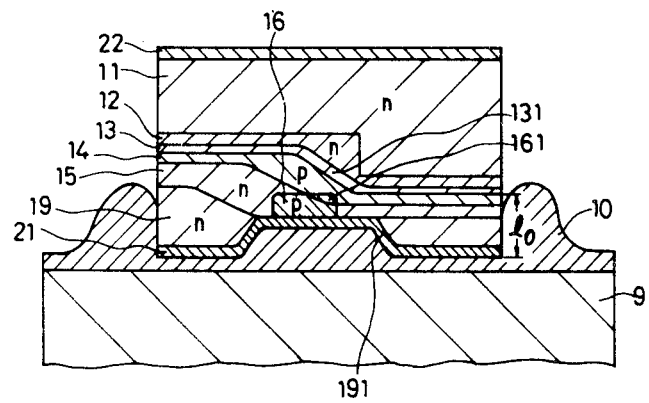
FIG. 4

TERRACED SUBSTRATE SEMICONDUCTOR LASER

BACKGROUND OF THE INVENTION

Four persons of the inventors proposed in the Japanese application No. Sho 55-13159 a semiconductor laser fabricated on a terraced substrate to oscillate with a stable transverse mode. The configuration of the preferred example of the proposed laser comprises layers and region as shown in FIG. 1, a terraced substrate 1 of . . . n-GaAs having a terrace step thereon, a first clad layer 2 (a first epitaxial layer) of . . . n-$Ga_{1-x}Al_xAs$, an active layer 3 (a second epitaxial layer) of . . . non doped $Ga_{1-y}Al_yAs$, a second clad layer 4 (a third epitaxial layer) of . . . p-$Ga_{1-z}Al_zAs$, and a cap (current limiting) layer 5 (a fourth epitaxial layer) of . . . n-GaAs, and besides, a current injection region 6 . . . p-type Zn diffused region.

The first to fourth epitaxial layers 2 to 5 are formed on the terraced face of the substrate 1 by a known sequential liquid phase epitaxial growths. Therefore, the first clad layer 2 is formed to have triangular-section part at the step part, and active layer 3 has two bending at the upper end and the lower end of the triangular-section part defining an inclined region 31 therebetween. The inclined region has a larger thickness than other parts (upper horizontal part and lower horizontal part) and constitutes a strip shaped lasing region 31 wherein light oscillation is effectively confined. The triangular-section part of the first clad layer 2 is formed sufficiently thicker than the other parts of the first clad layer 2 and prevents leakage of the oscillated light therethrough, while in the other parts the oscillated light leaks out from the lasing region 31 therethrough, thereby suppressing undesirable oscillation in regions other than the lasing region 31. The second clad layer 4 is also formed thicker at the part on the inclined lasing region 31 than at the parts on the other parts of the active layer 3. The current limiting layer 5 (fourth epitaxial layer) is formed to grow in a manner to form its upper face substantially flat or horizontal at the part over the lasing region 31. The current injection region 6 is formed by diffusing Zn as p-type impurity in a strip shape pattern from the surface of the fourth epitaxial layer 5 in a manner that a corner of the diffused front goes into and remains in the second clad layer 4 at the part over the lasing region 31. Ohmic electrodes 7 and 8 are formed as the p-side electrode and n-side electrode, respectively, and the wafer which is manufactured to have arrays of a plural of laser unit thereon is cut into individual laser pieces by cleaving the wafer, then the unit laser is bonded on a heat sink stem 9 as shown by FIG. 2 upside down by bonding the p-side electrode 7 on the stem 9 by means of indium solder 10, to complete a laser device.

In the above-mentioned semiconductor laser proposed by four of the present inventors, though the performance is excellent, there is a problem of manufacturing that the diffusion front of the current injection region 6 should be controlled very accurately in order that the edge of the diffusion front reaches and remains in the second clad layer 4. In order to attain such accurate controlling, the current limiting layer 5 can not be made thick. Accordingly, at the peripheral part of the side of thicker part of the substrate 1, distance "l" from the surface of the p-side electrode 7 to the active layer 3, i.e., the total thickness of the layers 4, 5 and 7 has been fairly thin, thereby being liable to undesirable shortcircuiting of the active region 3 by the indium solder 10. That is, the pushed up parts of the molten solder 10 around the periphery of the semiconductor laser chip and irregular tip of the torn tip of the ohmic electrode 7 formed by cleaving of the wafer is likely to induce the shortcircuiting between the p-side ohmic electrode 7 and the active layer 3. This is because the short distance l, which is in actual device about only 2 $\mu$m, is likely to induce a shortcircuit between the electrode 7 and the active layer 3 by the rise-up of the solder 10, when the semiconductor laser unit chip is put upside down on to the heat sink 9 and mounted thereon. Hitherto, such shortcircuitings have taken place in about 30 to 40% of the total manufactured semiconductor lasers.

Furthermore, since the current limiting layer 5 can not be made sufficiently thick in order to assure the accurate control of the diffusion to form the current injection region 6, the upper face of the p-side electrode 7 can not be made flat. Accordingly, the semiconductor chip is likely to be mounted undesirably tilted on the heat sink 9, and this also is likely to increase chances of the shortcircuitings.

Further, since the uppermost epitaxial layer (current limiting layer) 5 of the conventional device is GaAs layer, it is likely to occur that when a residue of GaAs solution remains on the surface of this uppermost layer, the surface evenness of the wafer is not good, resulting in poor contact between a photo-mask and the wafer surface in the subsequent photolithographic steps.

Thus, as a result of the above-mentioned shortcircuitings by the solder, the manufacturing yield of the terraced substrate type semiconductor lasers has not been sufficiently high.

SUMMARY OF THE INVENTION

The present invention purports to provide an improved semiconductor laser capable of attaining an improved manufacturing yield and good performance.

The semiconductor laser in accordance with the present invention is characterised by comprising on top of the current limiting layer of the conventional semiconductor laser of the terraced substrate type a further overriding epitaxial layer of GaAlAs having a considerable thickness (for example, about 2 $\mu$m) with a strip shaped opening for exposing the surface of the underlying current limiting layer therefrom and for diffusing a current injection region therefrom. As a result of providing the thick overriding epitaxial layer of GaAlAs, the shortcircuitings are removed and the surface evenness of the epitaxially grown wafer is much improved, and by forming the strip shaped opening in the overriding layer a sufficient controllability of diffusion front of the current injection region is assured, thus manufacturing yield of the semiconductor laser is improved.

BRIEF DESCRIPTION OF THE DRAWING

FIG. 3(a), FIG. 3(b), FIG. 3(c) and FIG. 3(d) are sectional views illustrating steps of fabricating a semiconductor laser embodying the present invention.

FIG. 4 is a sectional view of the semiconductor laser of FIG. 3(d) mounted on a heat sink by soldering upside down.

DESCRIPTION OF THE PREFERRED EMBODIMENT

Figure 1:
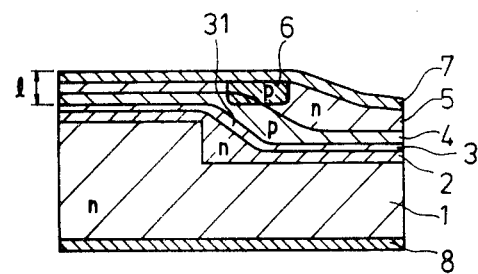
FIG. 1 is the sectional view of the exemplary conventional terraced substrate type semiconductor laser.
Figure 2:
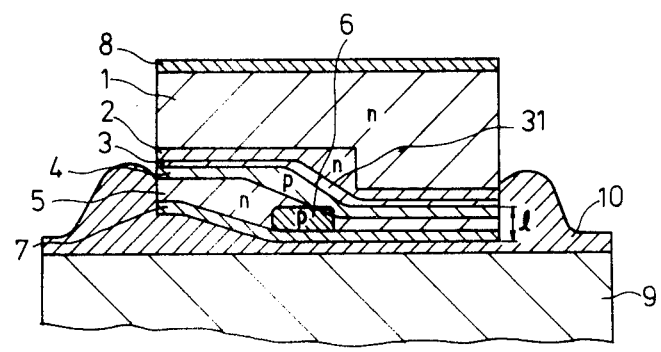
FIG. 2 is the sectional view of the semiconductor laser of FIG. 1 mounted on the heat sink by soldering upside down.

The present invention is elucidated referring to FIG. 3(a), FIG. 3(b), FIG. 3(c), FIG. 3(d) and FIG. 4 which show steps of manufacturing of an exemplary semiconductor laser of terraced substrate type embodying the present invention.

First, an n-conductivity type semiconductor substrate 11 with a terraced surface, i.e., a surface with a step 111 shown in FIG. 3(a), is provided as a starting substrate. The following first to fifth epitaxial layers are formed by sequential liquid phase epitaxial growths as shown by FIG. 3(b) on the terraced surface of a terraced substrate 11 of . . . n-GaAs:

a first clad layer 12 (a first epitaxial layer) of . . . n-Ga$_{1-x}$Al$_x$As, an active layer 13 (a second epitaxial layer) of . . . non-doped Ga$_{1-y}$Al$_y$As, a second clad layer 14 (a third epitaxial layer) of . . . p-Ga$_{1-z}$Al$_z$As, a current limiting layer 15 (a fourth epitaxial layer) of . . . n-GaAs and an overriding layer 19 (a fifth epitaxial layer) of . . . n-GaAlAs.

Since the substrate 11 has the terraced configuration, the first clad layer 12 is formed to have a triangular-section part at the step part, and the active layer 13 is formed to have two bendings at the upper end and at the lower end of the triangular-section part defining an inclined region 131 therebetween. The inclined region 131 of the active region has a larger thickness than other parts (upper horizontal part and lower horizontal part) and constitutes a strip shaped lasing region 131 wherein light oscillation is effectively confined. The first layer (12), the second layer (13) and the third layer (14) define a double heterojunction structure which contains an active layer therein.

The relation between the etching speed of the overriding layer 19 and the underlying layer 15 should be selected such that the overriding layer 19 has a larger etching speed than that of the underlying current limiting layer 15 in chemical etchings by etchant liquid; and the overriding layer 19 is grown to have 2 to 3 μm thickness so that the upper surface thereof becomes flat or horizontal, that is, substantially in parallel to upper part and lower part of the principal face of said substrate 11 as shown in FIG. 3(b). When the current limiting layer 15 is of n-GaAs, by forming the overriding layer 19 with n-GaAlAs the above-mentioned relation is fulfilled, and furthermore the upper surface of the overriding layer after finishing of the liquid phase growth.

Then, by means of known photolithographic selective etching method, a strip shaped part of the overriding layer 19 is removed, so as to form a strip shaped opening 191 thereby to expose a strip shaped part of the surface of the underlying current limiting layer 15, the strip shaped part being above the inclined lasing region 131. Then, after forming a diffusion mask 20, such as Si$_3$N$_4$ film, having a pattern to have strip shaped opening 201 at above the lasing region 131, Zn as p-type impurity is diffused through the opening 201, so that a p-type current injection region 16 is formed above the lasing region 131 as shown in FIG. 3(c). Position of one edge of the diffusion front of the current injection region 16 is so selected as to reach and remain in the second clad layer 14 preferably at the part near the upper end part of the lasing region 131; and the position of the other edge of the diffusion front of the current injection region 16 is so selected as to remain in the current limiting layer 15. After removing the diffusion mask 20, a p-side ohmic electrode 21 is formed and an n-side ohmic electrode 22 is formed as shown in FIG. 3(d). Then the wafer, which is manufactured to have arrays of a plural of laser unit thereon is cut into individual laser pieces by cleaving the wafer. Then the unit laser is bonded on a heat sink 9 as shown by FIG. 4 upside down by bonding the p-side electrode 7 on the stem 9 by means of indium solder 10, to complete a laser.

The manufacturing of the laser is elucidated more in details in the following for an actual example of GaAs-GaAlAs semiconductor laser comprising an n-conductivity type terraced substrate.

On a (100) face of an n-GaAs substrate 11, a step 111 of about 1.5 μm height is formed in the <011> direction by a known chemical etching method as shown in FIG. 3(a). Then, by means of known liquid phase epitaxial growth with a growth starting temperature of 845° C. and cooling rate of 0.5° C./min., the following layers are sequentially grown as shown in FIG. 3(b):

the first clad layer 12 of . . . n-Ga$_{0.65}$Al$_{0.35}$As of 0.2 μm thick (at the horizontal flat parts), the active layer 13 of . . . non-doped Ga$_{0.95}$Al$_{0.05}$As of 0.1 μm thick (at the lasing region 131).

the second clad layer 14 of . . . p-Ga$_{0.65}$Al$_{0.35}$As of 1 μm (at above the lasing region 131).

the current limiting layer 15 of . . . n-GaAs of 0.5 μm (at above the thicker part of substrate 11), and the overriding layer 19 of . . . n-Ga$_{0.4}$Al$_{0.6}$As of 2-3 μm (at above the thicker part of substrate 11).

A strip shaped opening 191 of 20 μm width is formed in the overriding layer 19, by utilizing an etchant prepared by blending 113 g of KI, 65 g of I$_2$ and 100 g of H$_2$O and applied at a room temperature. The etching speed of the overriding layer 19 is about 0.1 μm/sec. while that of the current limiting layer 15 is unobservably small. Accordingly, when the overriding layer 19 is etched away and the underlying surface of the current limiting layer 15 is exposed therefrom, then the latter is not etched in substance. Then the Si$_3$N$_4$ diffusion mask 20 is formed by known sputtering to the thickness of about 3000° Å, and diffusion opening 201 of about 5 μm width is formed at above the lasing region 131. Then, Zn as impurity is diffused through the opening into the current limiting layer 15, so that one diffusion front reaches the second clad layer 15 at above the lasing region 131, and the current injection region 16 is formed as shown in FIG. 3(c). Then after removing the Si$_3$N$_4$ diffusion mask 20, the p-side electrode 21 is formed by sequential sputterings of Ti and Pt, followed by deposition of Au. Then, by depositing AuGeNi on the bottom face of the substrate 11, followed by alloying treatment and subsequent Au-deposition, the n-side electrode 22 is formed. The laser is cleaved to form the individual piece shown in FIG. 3(d), which is then bonded upside down on the heat sink 9 as shown by FIG. 4.

The laser manufactured in accordance with the present invention has the terraced substrate, the first clad layer 12, the active layer 13 with an inclined lasing region 131, the second clad layer 14, the current limiting layer 15 of the same conductivity type to the substrate 11, the thick overriding layer 19 of the same conductivity type to the substrate 11 and having strip shaped opening 191 above the lasing region 131 and the current injection region 16 of the opposite conductivity type to the substrate 11 diffused with a good control from the surface of the current injection region 15 exposed through the strip shaped opening 191.

As shown in FIG. 4 the distance "$l_0$" from the surface of the p-side electrode 21 to the active layer 13 can be made over 2 or 3 μm by growing the overriding layer 19 to have a sufficient thickness. Therefore, the semiconductor laser in accordance with the present invention is substantially free from undesirable shortcircuitings by touching of rise-up part of the In-solder to the active layer 13. Besides, the upper surface can be made flat or horizontal ensuring stable and perfect bonding without undesirable inclination onto the heat sink 9. Furthermore, since the diffusion of the current injection region 16 is carried out from the surface of the current limiting layer 15 exposed in the opening 191, the diffusion front 161 can be accurately controlled to reach and remain in the second clad layer 15 thereby to attain effective current injection to the lasing region 131. Furthermore, by forming the uppermost layer 19 by the GaAlAs epitaxial layer, the surface evenness of the uppermost surface is satisfactory, and thereby the bonding force is strong.

Thus, the present invention enables drastic improvement of the manufacturing yield, and the rate of shorcircuiting defects was minimized to several percent only, and the manufactured laser had stable performance.

What is claimed is:

1. In a semiconductor laser comprising:
    a terraced substrate having a step on its principal face,
    a first epitaxial layer, a second epitaxial layer as an active layer and a third epitaxial layer formed in said order on said principal face for forming a double heterojunction structure wherein an active region is defined between two bendings of said active layer,
    a fourth layer formed on said third layer, characterized in that
    a fifth layer having the same conductivity as that of said substrate, formed on said fourth layer and having an opening above said active region, and
    a diffused region formed by a diffusion of an impurity to form an opposite conductivity type to that of said fourth layer through said opening into said fourth layer in a manner that one corner of a diffusion front penetrates said third layer.

2. In a semiconductor layer in accordance with claim 1, wherein said fifth layer has a larger etching speed than that of fourth layer against an etchant.

3. In a semiconductor laser in accordance with claim 1, wherein said fifth layer has a flat and even surface which is substantially parallel to said principal face of said substrate, except for said opening part.

4. In a semiconductor laser in accordance with claim 3, wherein
    an ohmic electrode is formed to cover a surface of said fourth layer exposed in said opening and extending onto said flat and even surface of said fifth layer, and
    said electrode is bonded by a bonding metal onto a bonding face of a heat sink, disposing said wafer upside down on said heat sink.

5. In a semiconductor laser in accordance with claim 4, wherein said bonding metal is a low melting temperature solder.

6. In a semiconductor laser in accordance with claim 3, wherein said corner is above said active region.

7. In a semiconductor laser in accordance with claim 3, wherein
    said terraced substrate is an n-type GaAs having a face as said principal face and a step in <011> direction,
    said first epitaxial layer is a first clad layer formed with an n-type GaAlAs,
    said second epitaxial layer is formed with a non-doped GaAlAs,
    said third epitaxial layer is a second clad layer formed with a p-type GaAlAs,
    said fourth epitaxial layer is a current limiting layer of n-type GaAs, and
    said fifth epitaxial layer is an n-type GaAlAs having a thickness larger than any of those of said first to fourth epitaxial layers.

* * * * *